United States Patent
Van Der Heijden

(10) Patent No.: US 7,355,479 B2
(45) Date of Patent: Apr. 8, 2008

(54) NEUTRALIZATION OF FEEDBACK CAPACITANCE IN AMPLIFIERS

(75) Inventor: Mark Van Der Heijden, Den Haag (NL)

(73) Assignee: NXP B.V., Eindhoven (NL)

( * ) Notice: Subject to any disclaimer, the term of this patent is extended or adjusted under 35 U.S.C. 154(b) by 251 days.

(21) Appl. No.: 10/550,349

(22) PCT Filed: Mar. 25, 2004

(86) PCT No.: PCT/IB2004/050330

§ 371 (c)(1),
(2), (4) Date: Sep. 23, 2005

(87) PCT Pub. No.: WO2004/086608

PCT Pub. Date: Oct. 7, 2004

(65) Prior Publication Data

US 2007/0046376 A1     Mar. 1, 2007

(30) Foreign Application Priority Data

Mar. 28, 2003  (EP) ................... 03075877

(51) Int. Cl.
*H03F 1/14* (2006.01)
(52) U.S. Cl. .............. 330/292; 330/302; 330/294; 330/149
(58) Field of Classification Search ........... 330/292, 330/302, 294, 149
See application file for complete search history.

(56) References Cited

U.S. PATENT DOCUMENTS

| | | | | |
|---|---|---|---|---|
| 3,952,260 A | * | 4/1976 | Prochazka et al. | 330/149 |
| 6,081,159 A | * | 6/2000 | Kim et al. | 330/149 |
| 6,369,655 B2 | * | 4/2002 | Nishida et al. | 330/294 |
| 6,556,085 B2 | * | 4/2003 | Kwon et al. | 330/311 |
| 6,704,559 B1 | * | 3/2004 | Hageraats | 455/326 |
| 7,256,646 B2 | * | 8/2007 | Eid et al. | 327/563 |

* cited by examiner

*Primary Examiner*—Patricia Nguyen
(74) *Attorney, Agent, or Firm*—Peter Zawilski

(57) ABSTRACT

A transistor amplifier circuit has a current to current feedback transformer for neutralization of feedback capacitance and setting the input impedance of the amplifier. IM3 cancellation is implemented by out-of-band terminations at the input, which does not depend on the loading of the output of the amplifier. The IM3 cancellation contributes better linearity, while the capacitance neutralization contributes high and stable gain. These features are more orthogonal than other prior art techniques in terms of gain and linearity over a wide dynamic range. Hence there is less of a trade-off between the desirable properties of high gain and good linearity. Notably they can be implemented to have good efficiency and high levels of integration, which are important for many applications such as wireless transceivers for portable devices or consumer equipment. The amplifier can be a single ended or a differential common emitter amplifier. It can use GaAs HBTs for RF applications or other bipolar technologies (SiGe HBT, GaAs HBT, Si BiT).

19 Claims, 3 Drawing Sheets

$$n = \frac{1}{k}\sqrt{\frac{L_1}{L_2}}$$

NEUTRALIZATION OF FEEDBACK CAPACITANCE IN AMPLIFIERS

This invention relates to amplifier circuits, to such circuits applied in wireless transceivers, particularly single ended or differential amplifiers having circuitry for cancellation of third order intermodulation distortion (IM3), and for neutralization of feedback capacitance, and to corresponding methods of using such amplifiers for producing amplified signals.

Figure 1:
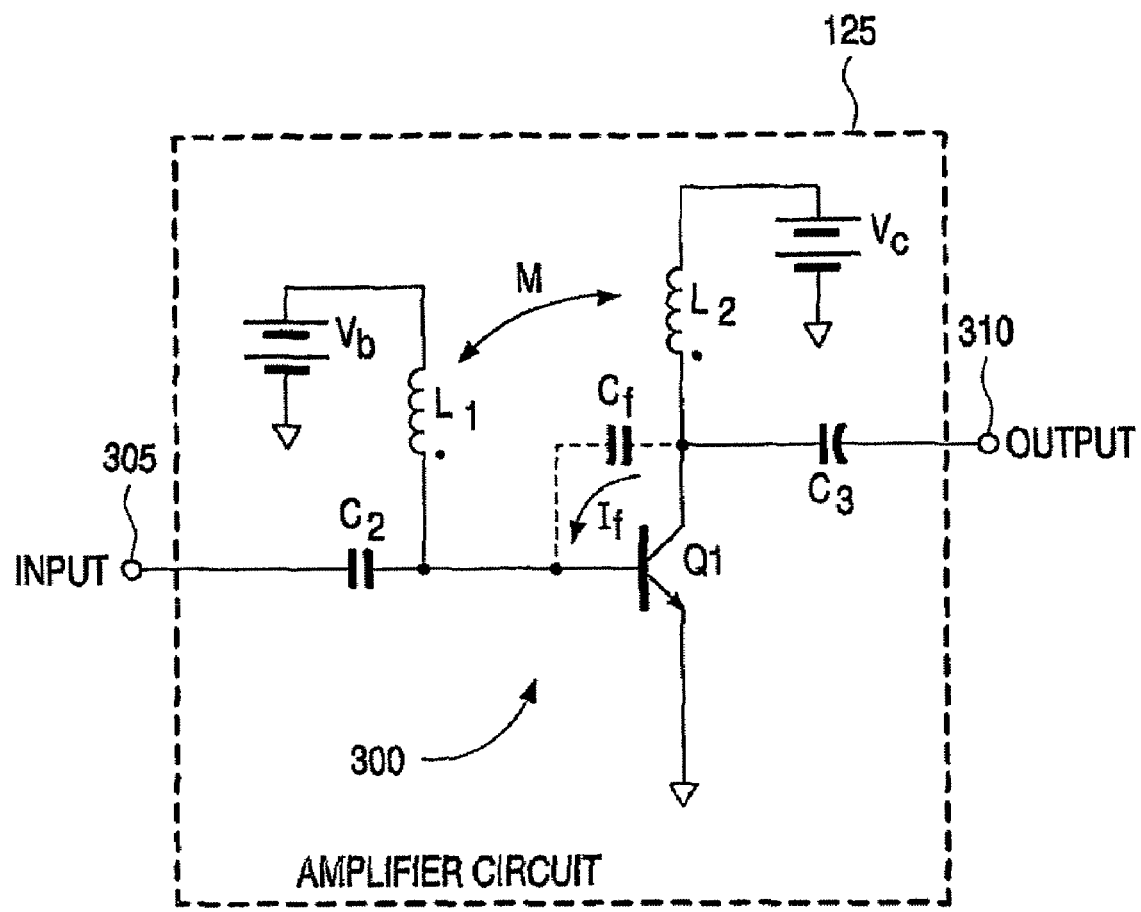

It is known from U.S. Pat. No. 6,211,738 to provide inductors for neutralization of parasitic capacitance such as collector-base capacitance or drain-gate capacitance of a single ended amplifier, as shown in FIG. 1. This is shown for amplifiers using a heterojunction bipolar transistor (HBT) formed on a gallium arsenide substrate, for application in amplifying MMICs (Monolithic Microwave Integrated Circuit). Also mentioned are other types of transistors such as metal-semiconductor field-effect transistors (MESFET), metal-oxide-semiconductor field-effect transistors (MOSFET), complementary metal-oxide-semiconductor transistors (CMOS). Such amplifiers are subject to reduced gain when feedback between the input and output signals occurs, and to instability from such feedback. The inclusion of an inductive element between the output and the input terminals can create a parallel resonant circuit with the feedback capacitance which presents a higher impedance feedback path at the resonant frequency. An improvement is suggested of providing inductors at the input and output of an amplifier positioned so that a mutual inductance is created between the two inductors. This provides an inductive feedback path to cancel the inherent capacitive feedback of transistor amplifiers. A large value of effective inductance can be obtained by using relatively small inductors, and can avoid the problem of low-frequency instability. Nevertheless, this document does not suggest how to improve linearity. The figure shows amplifier circuit 125 comprising a transistor amplifier 300 using inductive coupling to resonate with the feedback capacitor. The transistor amplifier 300 contains capacitors $C_2$ and $C_3$, a transistor $Q_1$, and inductors $L_1$ and $L_2$. Power sources $V_b$ and $V_c$ are provided for the transistor $Q_1$. The presence of the inherent feedback between the collector and the base is indicated in dotted lines by a capacitor $C_f$. The feedback current from the output of the transistor $Q_1$ to the input of the transistor $Q_1$ is indicated by a current $I_f$. Input signal 305 is coupled to a first terminal of the capacitor $C_2$. The second terminal of the capacitor $C_2$ is connected to the fist terminal of the inductor $L_1$ and a base of the transistor. The second terminal of the inductor $L_1$ is connected to a first terminal of a power source $V_b$. The emitter of the transistor is connected to ground. The collector of the transistor is connected to a first terminal of the inductor $L_2$ and the second terminal of the capacitive feedback path. The second terminal of capacitor $C_3$ is connected as the output signal 310. The second terminal of the inductor $L_2$ is connected to a first terminal of a power source $V_c$. The inductors are physically positioned so as to create a mutual inductance M between them.

It is known from U.S. Pat. No. 4,692,712 to provide neutralization for a common base differential amplifier, using cross coupled transistors. The neutralization circuit includes a pair of emitter followers, one coupled to the collector of each transistor of a common base amplifier for sensing the output voltage at each collector. A pair of transistors are coupled one to each emitter follower for applying the sensed voltage across a neutralizing impedance proportional to the parasitic impedance seen at the collector of the opposite transistor of the common base amplifier. The voltage applied across the neutralizing impedances produces a correction current.

Bridge neutralization for a tuned RLC Intermediate Frequency amplifier is shown in J. A. Mataya, G. W. Haines, and S. B. Marshall, "IF Amplifier Using Cc Compensated Transistors," *IEEE Journal of S-SC*, vol. sc-3, no. 4, pp. 401-407, December 1968, hereinafter "Mataya". Neutralization for a single ended amplifier by using an inverting transformer is shown in T. Lee, "The Design of CMOS Radio-Frequency Integrated Circuits," Cambridge University Press, 1998, hereinafter "Lee". The effect of out of band terminations on intermodulation distortion in common emitter circuits is shown in V. Aparin, and C. Persico, "Effect of Out-of-band Terminations on Intermodulation Distortion in Common-Emitter Circuits," 1999 *IEEE MTT-S Digest*, pp. 977-980, June 1999 hereinafter "Aparin" '99.

It is known from Philips semiconductors report RNR-T45-96-B-1025, "Improved IP3 behavior of the 900 Mhz Low Noise Amplifier with the BFG425W" 10 Dec. 1996, that a single ended LNA can be optimized for highest IP3 (Third-order intercept point, which is the input power at which the fundamental output power=third order intermodulation (IM3) output power) by providing an extra series capacitor for decoupling of the base to the ground, or by increasing $I_c$.

It is known to improve linearity by cancellation of third order intermodulation distortion (IM3) in a common emitter amplifier using series feedback or emitter degeneration as shown in K. Leong Fong and R. G. Meyer, "High-frequency nonlinearity analysis of common-emitter and differential pair transconductance stages," *IEEE J. Solid-State Circuits*, vol. 33, pp. 548-555, April 2002, hereinafter "Fong". A drawback of this technique is that it also reduces the available gain of the amplifier stage. However, a simultaneous match for gain/power and linearity is possible when controlling the baseband and second harmonic impedances in a balanced or single ended configuration. The basic principle of this technique is the separate treatment of IM3 products generated directly by third-degree nonlinearities, and IM3 products that are generated indirectly by mixing of first- and second-order products with second-degree nonlinearities of the exponential base-emitter junction. Doing so, cancellation will only occur if both IM3 contributions have opposite signs and equal amplitudes. This document sets out requirements for high-frequency IM3 cancellation regarding the common-mode impedances at the in- and output transformers.

G. Niu, et al., "RF Linearity Characteristics of SiGe HBT," *IEEE Trans. Microwave Theory and Techniques*, vol. 49, no. 9, pp. 1558-1565, September 2001, hereinafter "Niu", shows how intermodulation in SiGe HBTs can be measured and contributions from different nonlinearities can be distinguished. Feedback capacitance is shown to cause load dependent nonlinearity. Optimization of linearity by adjusting biasing and transistor collector doping is suggested, even though this causes a trade-off as it limits the cut-off frequency of the devices.

It is an aim of the invention to provide improved apparatus or methods. According to a first aspect, the invention provides a transistor amplifier circuit having circuitry for cancellation of third order intermodulation distortion (IM3), and for neutralization of feedback capacitance.

The IM3 cancellation contributes to better linearity, while the capacitance neutralization contributes high and stable gain. These features are more orthogonal than other prior art techniques in terms of gain and linearity over a wide dynamic range. Hence there is less of a trade-off between the desirable properties of high gain and good linearity. Notably they can be implemented to have good efficiency and high levels of integration, which are important for many applications such as wireless transceivers for any kind of portable devices or consumer equipment.

As a preferred additional feature, the amplifier is a single ended amplifier. These can be used for low noise amplifiers, and have advantages including lower noise figure due to the absence of a lossy balun at the input, high isolation, and smaller chip area.

As a preferred additional feature the circuitry for feedback capacitance neutralization comprises a current to current feedback transformer with a capacitance parallel coupled at the output path of the amplifier. An alternative way of achieving such neutralization in a differential amplifier is cross-coupled feedback capacitors, but they do not reduce the common-mode feedback capacitance, and they make the IM3 cancellation dependent on the loading at the output of the amplifier.

As a preferred additional feature, the circuitry for cancellation of third order intermodulation distortion is located at the input of the amplifier, and does not depend on the loading of the transistor due to the neutralization of the feedback capacitance.

As a preferred additional feature, the current to current feedback transformer is also used for the capacitance neutralization. This can enable component count to be kept low. The values of inductances in the transformer can be tailored to enable both input matching (e.g. for noise), and capacitance neutralization together with the capacitor $C_N$, which enables the transformer to become dual purpose. The IM3 cancellation requirements depend on the input out-of-band terminations (baseband and second-harmonic termination). The noise and impedance match does depend on device scale and current, if base resistance is taken into account (Ref: The IM3 cancellation theory as discussed in M. P. van der Heijden, H. C. de Graaff, and L. C. N. de Vreede, "A Novel Frequency-Independent Third-Order Intermodulation Distortion Cancellation Technique for BJT Amplifiers," IEEE J. Solid-State Circuits, Vol. 37, No. 9, pp. 1176-1183, September 2002. and V. Aparin and C. Persico), however in the ideal case (rb=0) the optimum noise impedance is conjugate to the input impedance of the bipolar transistor for all current levels and device scales.

As a preferred additional feature, the current to current feedback transformer comprises a first inductor parallel coupled to an input of the amplifier, and a second inductor series coupled in an output path of the amplifier, the inductors being located to provide inductive mutual coupling. As a preferred additional feature, the circuitry for capacitance neutralization comprises a capacitor parallel coupled to the output path. The combination of current feedback transformer with a capacitor $C_N$ at the output results in a frequency independent compensation of feedback capacitance.

As a preferred additional feature, an emitter of the transistor is grounded. This can help enable better IM3 cancellation. Otherwise, inductive series feedback in the emitter can lead to asymmetrical IM3 side bands for wideband signals.

As a preferred additional feature, the amplifier is a differential amplifier.

As a preferred additional feature, the amplifier is a differential common emitter amplifier.

As a preferred additional feature, the circuitry for cancellation of third order intermodulation distortion comprises resistive out of band terminations.

As a preferred additional feature, the circuitry for capacitance neutralization comprises a current feedback or a voltage feedback transformer.

Another aspect of the invention is a wireless transceiver having the amplifier circuit as described above.

Other aspects of the invention include methods of producing wireless signals using the transceiver. This is claimed separately to provide more cover for instances where the equipment is all or partly outside the jurisdiction, or where the value of the use is much greater than the capital value of the equipment alone.

Another aspect of the invention provides a single ended transistor amplifier circuit having a first inductor parallel coupled to an input of the amplifier, and a second inductor series coupled in an output path of the amplifier, the inductors being located to provide inductive mutual coupling, and a capacitor parallel coupled to the output path, the capacitor and the inductors being dimensioned to neutralize parasitic feedback capacitance. This has corresponding advantages whether or not combined with IM3 cancellation.

Another aspect of the invention provides a transistor amplifier circuit having two transistors in a differential common emitter arrangement, and having neutralization circuitry for neutralization of feedback capacitance, the neutralization circuitry comprising a current feedback or a voltage feedback transformer.

The additional features may be combined together or combined with other aspects of the invention as would be apparent to those skilled in the art. Other advantages may be apparent to those skilled in the art, particularly over other prior art not known to the inventor. How the present invention may be put into effect will now be described with reference to the appended schematic drawings. Obviously, numerous variations and modifications can be made without departing from the spirit of the present invention. Therefore, it should be clearly understood that the form of the present invention is illustrative only and is not intended to limit the scope of the present invention.

Figure 3:
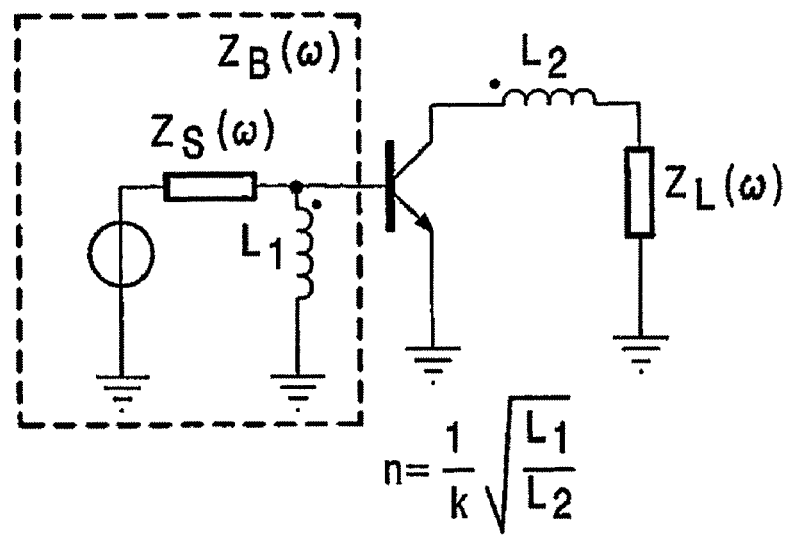
Figure 2:
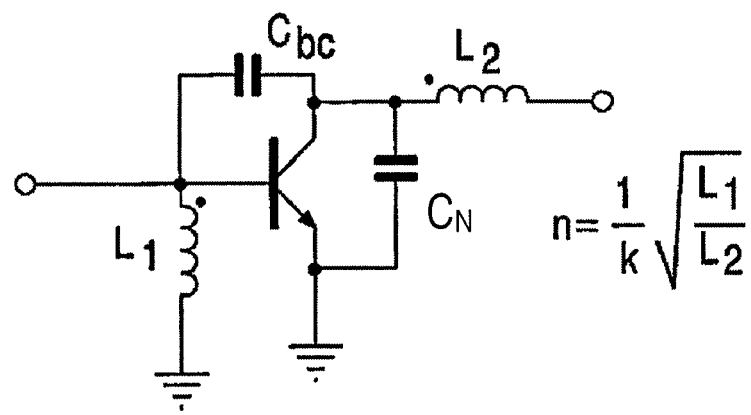
Figure 6:
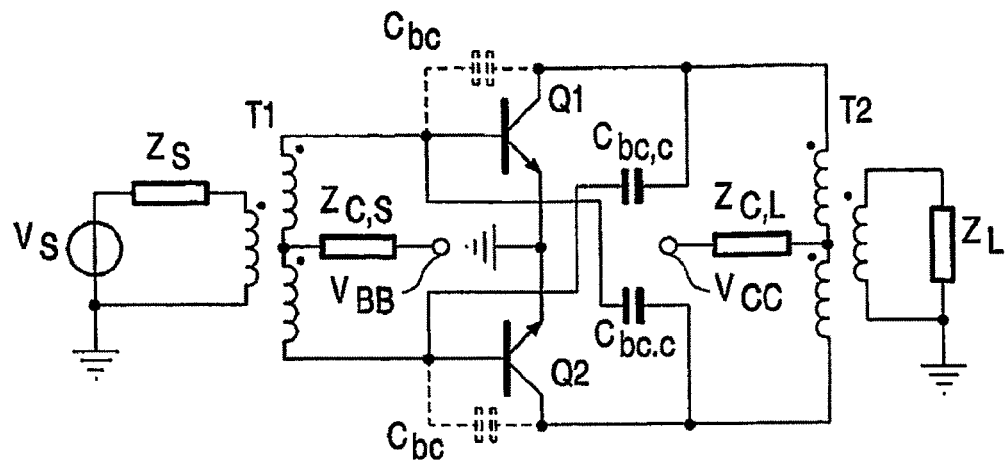
Figure 5:
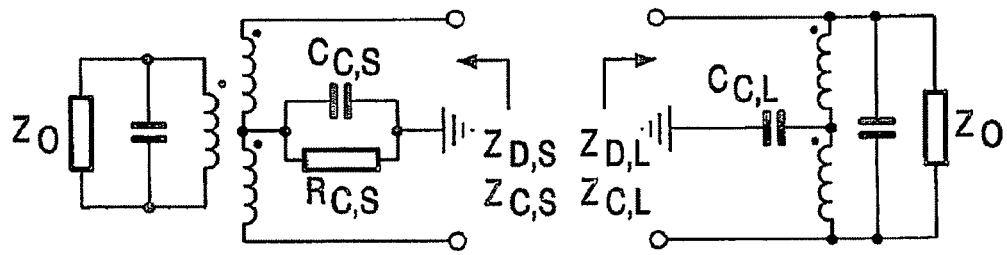
Figure 4:
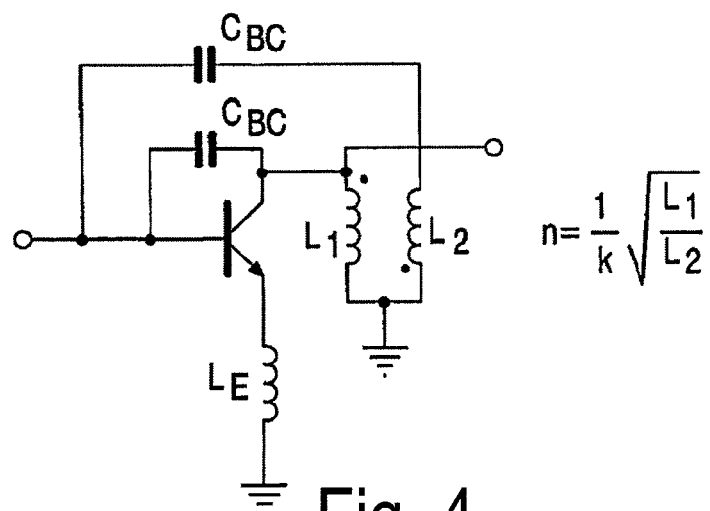

The features of the invention will be better understood by reference to the accompanying drawings, which illustrate preferred embodiments of the invention. In the drawings:

FIG. 1 shows a prior art single ended amplifier,

FIG. 2 shows an amplifier having neutralization of the feedback capacitance by means of a current-feedback transformer, according to an embodiment of the invention, FIG. 3 shows another embodiment having IM3 cancellation in a neutralized current feedback amplifier, FIG. 4 shows another embodiment having neutralization of the feedback capacitance by means of a voltage-feedback transformer, FIG. 5 shows another embodiment being a differential current feedback amplifier with unilateralization and IM3-cancellation, FIG. 6 shows another embodiment being a differential voltage feedback amplifier with unilateralization and IM3-cancellation.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

Embodiments of the invention described below include amplifiers utilizing two techniques individually or in combination. A first technique is a capacitance neutralization technique using a feedback transformer. A second technique is second-harmonic control implemented in the input (or output) matching networks which can yield a notable reduction of third-order intermodulation distortion (IM3).

Neutralization of Feedback Capacitance in RF Amplifiers:

Unilateralization of a transistor is in general achieved by neutralizing the effect of the feedback capacitance. This technique is generally applicable to basically all transistor technologies (Silicon BJT, SiGe HBT, GaAs HBT, GaAs MESFET, GaAs HEMT, MOSFET, etc). The main purpose of unilateralization is to achieve the maximum available gain of the transistor, while having unconditional stability over the whole frequency band. An additional advantage is that the input and output impedance can be matched independently since there is no interaction between the in- and output. This has also some advantages in the cancellation of third-order intermodulation distortion products (IM3), since it eases the requirements on the harmonic source and load terminations.

The IM3 cancellation theory as discussed in M. P. van der Heij den, H. C. de Graaff, and L. C. N. de Vreede, "A Novel Frequency-Independent Third-Order Intermodulation Distortion Cancellation Technique for BJT Amplifiers," *IEEE J Solid-State Circuits*, Vol. 37, No. 9, pp. 1176-1183, September 2002. and V. Aparin and C. Persico, "Effect of out-of-band terminations on intermodulation distortion in common-emitter circuits," *IEEE MTT-S Digest*, pp. 723-726, 1998, is dedicated to bipolar-based transistors technologies (Silicon BJT, SiGe HBT, GaAs HBT, and other HBTs). For FETs it is less straightforward to use these techniques, however, it is possible that similar cancellation phenomena are present in FET-based technologies, but these have to be explored in more detail to come to a general IM3-cancellation theory. The circuits discussed in this patent application can be helpful in this context, since the unilateral behavior of the amplifier stages lead to negligible interdependence of the in- and output non-linear sources within the transistors.

Equivalent Circuit:

The simplified high frequency equivalent circuit diagram of the BJT used in the description of all the embodiments of the invention. In this equivalent circuit:

$C_{jc}$=Collector-base depletion capacitance
$C_{je}$=Base-emitter depletion capacitance
$C_{de}$=Base-emitter diffusion capacitance
$C_{js}$=Collector-substrate depletion capacitance
$\beta_F$=Forward current gain
$\tau_F$=Forward transit time
$g_m=I_C/V_T$=transconductance
$V_T$=Termal voltage
$I_C$=Collector current The market for third-generation (3G) wireless personal communication systems demands linear low noise amplifiers (LNAs) operating at low DC bias conditions. In order to meet these requirements, various LNA implementations and topologies have been evaluated in the past. From these results, non-energetic feedback seems to be the best solution to approximate the minimum noise figure (F min) of the active device under input impedance matched conditions. In this perspective, the common-emitter stage with inductive series feedback (CEISF) is quite often favored due to its linearity, low noise and simplicity. A modification to this circuit by means of transformer feedback, offers some advantages over the CEISF in terms of stability and gain at low current levels. However, also here still a trade-off exists between linearity, gain and current level. To solve for this, circuit techniques have been introduced recently to improve the linearity of bipolar transistors by means of proper even harmonic out-of-band terminations. Although very effective, the drawback of this technique is the dependency of the linearity enhancement on the second-harmonic loading conditions at the in- and the output, complicating practical implementations. One aim is to provide a solution for the low gain typically found in feedback LNAs when operating at low current levels, while simultaneously, achieving a well-controlled linearity improvement independent of the output loading conditions. To tackle this problem, a novel circuit topology is introduced, which combines non-energetic transformer current-feedback (CF) and neutralization of the collector-base depletion capacitance ($C_{bc}$).

The result is a unilateral amplifier stage with excellent output-to input isolation, facilitating unconditional stability and a high maximum available power gain (MAG), even at low current levels. Moreover, the high isolation also proves to be beneficial in the design of the required optimum out-of-band terminations. The CF-topology is chosen for its simplicity, since it combines simultaneous noise and impedance match with neutralization in an elegant fashion. In theory, neutralization is also possible for the CEISF and other transformer feedback LNAs. However, the neutralization scheme would be much more complex, resulting in rather impractical implementations.

Current Feedback and Unilateralization:

First the general analytical formulation for neutralization in a CF amplifier will be explained. This is followed by a discussion of how simultaneous noise and impedance match is obtained in the LNA. In all the analyses, the base resistance ($r_b$) is neglected to keep the expressions manageable, since the aim is to provide good conceptual insight of the circuit topology. FIG. 2 shows a basic circuit diagram of a common emitter stage with current-feedback (CECF) and a neutralization element. The feedback transformer consists of two mutually coupled inductors $L_1$ and $L_2$ of which the turn ratio can be expressed as:

$$n = \frac{1}{k}\sqrt{L_1/L_2} \quad (1A)$$

where k is the magnetic coupling coefficient. The CECF stage becomes unilateral when the reverse admittance parameter ($y_{12}$) is zero. The $y_{12}$ of the CECF is calculated as follows:

$$y_{12} = \frac{i_1}{v_2}\bigg|_{v_1=0} = \frac{Y_N + n \cdot y_{CE12} + y_{CE22}}{1 - jwL_2(1-k^2)(Y_N + y_{CE22})} \quad (2A)$$

with $y_{CE12}$ and $Y_{CE22}$ being the small-signal reverse admittance and output admittance of the CE-stage, respectively, and $Y_N$ being the neutralization element. If the series resistances and the output conductance of the intrinsic BJT are neglected, these admittances are expressed as:

$$y_{CE12} = -j\omega C_{bc} \text{ and } y_{CE1=22} = j\omega(C_{cs} + C_{bc}) \quad (3A)$$

where Ccs is the collector-substrate depletion capacitance. Substitution of (3A) in (2A) yields the neutralization condition:

$$Y_N = j\omega[(n-1)C_{bc} - C_{cs}] = j\omega C_N \quad (4A)$$

Since the stage behaves unilaterally, the input admittance is independent of the load and is expressed as:

$$Y_{in} = \frac{g_m}{n} + j\left(\frac{1}{\omega L_1} + \omega C_{in}\right) \quad (5A)$$

where $C_{be}$, $\beta_F$ and $g_m$ are the total base-emitter capacitance, the forward current gain and the transconductance of the BJT, respectively which are used later in the noise calculation.

For the noise calculation the shot noise of the base and collector current is included with their power spectral density given by:

$$S(i_{bn}) = 2qI_b = 2kTg_m/\beta_F$$

$$S(i_{cn}) = 2qI_c = 2kTg_m \quad (6A)$$

The noise parameters for the circuit can be found using a noise correlation matrix computation method, yielding for the optimum noise admittance:

$$Y_{opt} = \frac{g_m}{\sqrt{\beta_F}} - j\left(\frac{1}{wL_1} + \omega C_{in}\right) \quad (7A)$$

When comparing the input admittance in (5A) with (7A) it is obvious that the requirement for simultaneous noise and impedance match is now completely determined by the transformer turn ratio n:

$$Y_S = Y_{opt} = Y^*_{in} \text{ if } n = \sqrt{\beta_F} \quad (8A)$$

Note that the previous analysis is a simplification of reality, since rb was neglected. However, the above provides a good starting point for the actual circuit design using a circuit simulator. The next step is the implementation of the optimum out-of-band terminations for a high input third-order intercept point (IIP3).

Optimum IP3 Terminations:

Optimum circuit conditions exist for cancellation of third order intermodulation distortion (IM3) by using proper even harmonic terminations at the input and output of a CE stage. Since the CECF stage is neutralized, the IM3-cancellation requirement does not depend on the load impedance. This greatly simplifies the expressions for the source terminations at the base-band:

$\Delta\omega = \pm(\omega_1 - \omega_2)$ and second-harmonic frequency
$2\omega \approx 2\omega_1 \approx 2\omega_2$ (for small $\Delta\omega$).

For the non-linear analysis the base current $i_b$ and the base-emitter diffusion capacitance $C_{de}$ depend linearly on the non-linear exponential collector current $i_c$ through $\beta_F$ and $\tau_F$, respectively. As a result of the CF a current source $(i_c/n)$ appears at the input, which also depends linearly on $i_c$. The total impedance connected to the base node $(v_1)$ is defined as $Z_1(\omega)$. Since the impedance of $L_1$ at $\Delta\omega$ is negligible, it is assumed that:

$$Z_1(\Delta\omega) = 0 \quad (9A)$$

Using the method shown in M. P. van der Heijden, H. C. de Graaff, and L. C. N. de Vreede, "A Novel Frequency-Independent Third-Order Intermodulation Distortion Cancellation Technique for BJT Amplifiers," IEEE J. Solid-State Circuits, Vol. 37, No. 9, pp. 1176-1183, September 2002, (hereinafter Heijden 2002), the required impedance at $2\omega$ can be calculated for M3-cancellation.

$$Z_s(2\varpi) = \frac{j2\varpi L_1}{(2\varpi)^2 L_1 C_{in} - 1} \quad (10A)$$

Ideally, this solution does not depend on current level, however, the cancellation will only occur for a single frequency. Note that if $r_b$ is not neglected, analysis shows that $Z_s(2\omega)$ will have a considerable real part, which also depends on $I_c$ again. A better solution would be $Z_1(\Delta\omega) = Z_1(2\omega) = r$, which ideally gives a frequency independent cancellation of IM3. However, condition (9) is more practical to realize, since $L_1$ already presents a short for the harmonics at $\Delta\omega$.

The embodiments described below are based on the above analysis, representing a new design approach for LNAs in order to meet the requirements for gain, linearity, and minimum noise figure at a minimum of DC power dissipation. Unilateralization and current feedback are combined in order to obtain simultaneous noise and impedance match at low current levels with unilateral gain. The high isolation ensures well-controlled optimum out-of-band termination for high linearity, which do not depend on the output termination of the LNA.

EMBODIMENT 1

FIG. 2 shows the first embodiment of the invention in which a current-feedback transformer is used together with a neutralization capacitance $C_N$. The feedback transformer consists of two mutual coupled inductors $L_1$ and $L_2$ with a turn ratio n as defined in FIG. 2.

In order to neutralize the collector-base depletion capacitance $C_{jc}$, the following condition should be met:

$$C_N + C_j = x(n + j)C_e \quad \text{Eq (1)}$$

where $C_{js}$ is the equivalent collector-substrate capacitance at the output of the BJT, which is in located in parallel with $C_N$.

Furthermore, the current feedback topology provides an extra degree of freedom in controlling the input impedance $Z_{IN}$ through the turn ratio n and the transconductance $g_m$ of transistor $Q_1$ independently of the load impedance $Z_L$:

$$Z_{IN}f = n(g_m) \qquad \text{Eq (2)}$$

This is particularly useful in the design of low-noise amplifiers (LNAs), when it is desired to make the input impedance the complex conjugate of the optimum noise impedance for a simultaneous noise/impedance match.

Compared to the prior art neutrodyne method, using a voltage inverting transformer, the method of FIG. 2 greatly reduces the dependence of the neutralization mechanism on the parasitics of the transformer, thus making it a broadband solution. The current feedback topology by means of a transformer has been well described by E. H. Nordholt, *Design of High-Performance Negative Feedback, Amplifiers*, Elsevier, 1983. Also, in S. J. Mason, "Power Gain in Feedback Amplifier," *IRE Trans. on Circuit Theory*, Vol. CT-1, pp. 20-25, June 1954, the existence has been proven of loss-less transformation networks, which combine feedback with unilateralization. However, there is no suggestion of the circuit solution of FIG. 2.

The parasitics for this type of transformer, will not cause any problems as one part of the cross-capacitance $C_{PC}$ between the windings is in parallel with $C_{FB}$ and can be taken into account. The other parasitic capacitances appear at the input and the output of the circuit and will not pose a problem. Hence there is no frequency dependency in the neutralization condition, thus giving the opportunity to use neutralization of feedback capacitance in an integrated circuit environment over a wide frequency range.

Note, that in general the turn ratio of the transformer is at least ten or higher ($n \geq 10$). This results in a large self-inductance $L_1$, which can be used as a matching element at the input of the amplifier. Since $L_1$ is big, it suffers from a parasitic substrate coupling. However, this element will appear in shunt with the input of the amplifier and will therefore not cause harm. The self-inductance $L_2$ can be made very small and thus has a very small parasitic substrate coupling, which is negligible in comparison with the cross-coupling capacitances.

If applied in an LNA, which uses a current feedback transformer in order to set the input impedance equal to the optimum noise impedance, then the turn ratio of the transformer can be optimized for the optimum noise match. Secondly the neutralization capacitance can be calculated to take into account the parasitics. Lastly, the optimum out-of-band input termination can be implemented in order to set the requirements on IP3, which is now independent of the load termination, as set out below.

IM3 Cancellation:

FIG. 3 shows another embodiment of the invention in which a current-feedback transformer is used together with a neutralization capacitance $C_N$ and a matching network at the input of the amplifier in order to set the requirements for IM3 cancellation.

Any arbitrary combination of $Z_S(\Delta\omega)$, and $Z_S(2\omega)$ can lead to IM3 cancellation, but these are in general frequency selective. The requirements for a wide band IM3 cancellation can be set by resistive out-of-band terminations at the base-emitter junction of the bipolar transistor $Q_1$, which mainly depend on the following parameters:

$$Z_S(\Delta\omega) = R_S(\Delta\omega)_m f = (\tau_F g, \beta_F n)$$

$$Z_S(\omega 2 = R_S(\omega 2_m f =) \tau(_F g, \beta_F n) \qquad \text{Eq. (3)}$$

Frequency independent IM3 cancellation will occur when:

$$R_S(\Delta\omega) = R_S(2\omega) = \frac{\beta_F n}{2g_m(\beta_F + n)} \qquad \text{Eq (4)}$$

when $$C_{IN} - C_{de} = r\tau_F g_m$$

where $C_{IN}$ is the total equivalent capacitance located at the base-emitter junction after neutralization of the feedback capacitance.

The source and load impedance at the fundamental frequency $Z_S(\omega)$, $Z_L(\omega)$ can be tuned independently for optimum gain and/or power transfer or for minimum noise. Furthermore, the second-harmonic load impedance $Z_L(2\omega)$ can be used to increase the efficiency or to improve the linearity when other non-linearities become dominant as well

EMBODIMENT 2

FIG. 4 shows another embodiment of the invention in which a voltage-feedback transformer is used together with a neutralization capacitance $C_N$ and a resistance $R_N$. The feedback transformer consists of two mutual coupled inductors $L_1$ and $L_2$ with a turn ratio n as defined in FIG. 4. The additional neutralization element RN originates from the fact that there is a non-negligible input resistance $r_\pi$ at the input of the transistor (see FIG. 1). If $R_N$ is neglected, an equivalent resistive feedback element would appear between the collector and the base due to the transformer feedback action, which makes the stage non-unilateral again even though $C_{jc}$ has been neutralized. Placing a real resistance $R_N$ across the base and the collector of the BJT can compensate for this effect. Note, that for FETs this extra measure is not necessary, since ideally there is no gate-source resistance, only a gate-source capacitance.

In order to obtain neutralization of $C_{jc}$, the following conditions should be met:

$$C_N + C_\pi = j(n-1)C_c \qquad \text{Eq (5)}$$

$$R_N = (n-1)r_\pi \qquad \text{Eq (6)}$$

where $r_\pi = \beta_F/g_m$ is the equivalent input resistance of the BJT, and $C_\pi = \tau_F g_m + C_{je}$ is the total equivalent input capacitance of the BJT, which includes the diffusion capacitance ($\tau_F g_m$) and the base-emitter depletion capacitance ($C_{je}$).

Furthermore, this implementation provides a controlled lowering of the output impedance $Z_{OUT}$ through the turn ratio n of the mutual inductors $L_1$ and $L_2$ together with the transconductance $g_m$ of transistor $Q_j$ independent of the source impedance $Z_S$:

$$Z_{OUT}f = n(g_m) \qquad \text{Eq. (7)}$$

This is particularly useful in the design of power amplifiers (PAs), when it is desired to match the output impedance for maximum output power and efficiency, or to enhance the wideband behavior for low to medium power amplifiers.

IM3 Cancellation:

In another embodiment of the invention in which a voltage-feedback transformer is used together with a neutralization capacitance $C_N$, a resistance $R_N$, and a matching network at the input of the amplifier in order to set the requirements for IM3 cancellation.

Any arbitrary combination of $Z_S(\Delta\omega)$, and $Z_S(2\omega)$ can lead to IM3 cancellation, but these are in general frequency selective. The requirements for a wide band IM3 cancellation can be set by resistive out-of-band terminations at the base-emitter junction of the bipolar transistor $Q_1$, which mainly depend on the following parameters:

$$Z_S(\Delta\omega)=R_S(\Delta\omega)_m f=(\tau_F, g, \beta_F, n)$$

$$Z_S(2\omega)=R_S(\omega 2_m)f=(\tau_F, g, \beta_F, n) \quad \text{Eq. (8)}$$

Frequency independent IM3 cancellation will occur when (shown here for the first time):

$$R_S(\Delta\omega)(R_S 2\omega) = \frac{\beta_F(n-1)}{g_m(2n-3)} \quad \text{Eq (9)}$$

when $$C_{IN} - C_d = 2\tau_F g_m$$

where $C_{IN}$ is the total equivalent capacitance located at the base-emitter junction after neutralization of the feedback capacitance. The derivation calculation is very extensive, and so is not presented here in full.

Unfortunately, the voltage feedback topology does not result in a perfect IM3-cancellation, since a small portion of the non-linear base-emitter current is transformed to the output, which cannot be compensated for by the conditions set in Eq (9). By adding a second-harmonic short at the output again perfect IM3 cancellation will occur:

$$Z_L(2\omega)=0 \quad \text{Eq (10)}$$

Note that once again the source and load impedance $Z_S(\omega)$, $Z_L(\omega)$ can be tuned independently for optimum gain and/or power transfer.

Additionally, a trade-off can be made between linearity and efficiency by tuning $Z_L(2\omega)$, if no perfect IM3 cancellation is required.

EMBODIMENT 3

Based on the single-ended current feedback topology in FIG. 3, a differential equivalent is shown in FIG. 5. The primary windings of the current feedback transformers ($L_1$, and $L_3$) form part of an input transformer $T_1$, which allows differential-mode and common-mode signals to be treated separately. The secondary windings of the current feedback transformers ($L_2$ and $L_4$) can be connected to an output transformer $T_2$, which also allows differential-mode and common-mode signals to be treated separately. In this way there is orthogonality in the requirements for linearity and impedance match at the fundamental frequency for power, gain, or noise.

Neutralization is as discussed in embodiment 1. Frequency independent IM3 cancellation will occur if the common-mode source impedance is set according to Eq (11):

$$Z_{SC}(\Delta\omega) = Z_{SC}(2\omega) = R_{SC} = \frac{\beta_F n}{4g_m(\beta_F + n)} \quad \text{Eq (11)}$$

The fundamental source and load impedance $Z_S(\omega)$, $Z_L(\omega)$ can be tuned independently for optimum gain and/or power transfer or for minimum noise.

Furthermore, the second-harmonic load impedance $Z_{L,C}(2\omega)$ appears as a common-mode impedance at the output transformer and can be used to increase the efficiency or to improve the linearity when other non-linearities become dominant as well. Note that this configuration in principle supports multi-octave bandwidth, since the out-of-band terminations are set through the common-mode impedance at the center tap.

EMBODIMENT 4

Based on the single-ended voltage feedback topology in FIG. 4, a differential equivalent is shown in FIG. 6. The secondary windings of the voltage feedback transformers ($L_2$, and $L_4$) form part of an output transformer $T_2$, which allows differential-mode and common-mode signals to be treated separately. The primary windings of the current feedback transformers ($L_1$, and $L_3$) can be connected to an input transformer $T_1$, which also allows differential-mode and common-mode signals to be treated separately. In this way there is orthogonality in the requirements for linearity and the match at the fundamental frequency for power, gain, or noise.

Neutralization is as Discussed in Embodiment 2:

Frequency independent IM3 cancellation will occur when (shown here for the first time):

$$Z_{S,C}(\Delta\omega) = Z_{S,C}(2\omega) = R_{S,C} = \frac{\beta_F(n-1)}{2g_m(2n-3)} \quad \text{Eq (12)}$$

when $$C_{IN} - C_d = 2\tau_F g_m$$

where $C_{IN}$ is the total equivalent capacitance located at the base-emitter junction after neutralization of the feedback capacitance. Furthermore in order to enforce full cancellation, a requirement on the second-harmonic common-mode load termination exists:

$$Z_{L,C}(2\omega)=0 \quad \text{Eq (13)}$$

The source and load impedance $Z_S(\omega)$, $Z_L(\omega)$ can be tuned independently for optimum gain and/or power transfer. Additionally, a trade-off can be made between linearity and efficiency by tuning $Z_{L,C}(2\omega)$, if no perfect IM3 cancellation is required.

FURTHER EMBODIMENTS

Further embodiments of the invention, in the form of single ended amplifiers can use bipolar transistors for use as LNAs for example, though as mentioned above, other types of transistors can be used, such as metal oxide transistors. As has been described above, a transistor amplifier circuit has a current to current feedback transformer for neutralization of feedback capacitance and setting the input impedance of the amplifier. IM3 cancellation is implemented by out-of-band terminations at the input, which does not depend on the loading of the output of the amplifier. The IM3 cancellation contributes better linearity, while the capacitance neutralization contributes high and stable gain. These features are more orthogonal than other prior art techniques in terms of gain and linearity over a wide dynamic range. Hence there is less of a trade-off between the desirable properties of high gain and good linearity. Notably they can be implemented to have good efficiency and high levels of integration, which are important for many applications such as wireless transceivers for portable devices or consumer equipment. The amplifier can be a single ended or a differential common emitter amplifier. It can use GaAs HBTs for RF applications or other bipolar technologies (SiGe HBT, GaAs HBT, Si BJT).

Other variations will be apparent to those skilled in the art and are intended to be encompassed within the claims.

A Comparison of the Embodiments:

A possible less advantageous aspect of embodiment 1 is that it may be difficult to implement the resistive termination at $\Delta\omega$ required for wide band IM3 cancellation, since the primary winding of the current feedback transformer is grounded ($L_1$) and forces almost zero impedance at this frequency. This can be solved by using embodiment 3, where this is not a problem.

However, using embodiment 3, it may be difficult to obtain the minimum noise figure of the transistor technology, since it is masked by the losses of the input transformer balun. It is up to the designer, which figure is more important, linearity over a wide frequency band or noise.

Embodiment 2 and 4 are preferable for low to medium power amplifiers in mobile communication systems, since the output impedance can be tuned for maximum power transfer besides the gain improvement due to the neutralization technique. The extra requirement on the second-harmonic load impedance (short) is only required for perfect IM3 cancellation. In practice this will give not too many problems, since for a good class-AB efficiency, a short is needed for the output impedance at the second-harmonic frequency.

Embodiment 3 is the best in terms of linearity over a wide bandwidth, since it is not limited by a second-harmonic short at the output. Ideally, this circuit would give the ultimate frequency-independent IM3 cancellation. One alternative, of using cross-coupled feedback capacitors for neutralization causes a high common-mode feedback path, which makes the IM3 cancellation dependent on the second-harmonic load termination again. In this perspective, embodiment 4 is also better since there is no interaction with the input of the amplifier through a common-mode feedback path, although it requires a second-harmonic load termination for perfect cancellation.

REFERENCES

M. P. van der Heijden, H. C. de Graaff, and L. C. N. de Vreede, "A Novel Frequency-Independent Third-Order Intermodulation Distortion Cancellation Technique for BJT Amplifiers," *IEEE J. Solid-State Circuits*, Vol. 37, No. 9, pp. 1176-1183, September 2002.

V. Aparin and C. Persico, "Effect of out-of-band terminations on intermodulation distortion in common-emitter circuits," *IEEE MTT-S Digest*, pp. 723-726, 1998.

F. van Rijs, et al., "Influence of Output Impedance on Power Added Efficiency of Si-Bipolar Power Transistors," 2000 *IEEE MTT-S Digest*, vol. 3, pp. 1945-1948, June 2000.

G. Niu, et al., "RF Linearity Characteristics of SiGe HBT," *IEEE Trans. Microwave Theory and Techniques*, vol. 49, no. 9, pp. 1558-1565, September 2001.

E. H. Nordholt, *Design of High-Performance Negative Feedback Amplifiers*, Elsevier, 1983.

S. J. Mason, "Power Gain in Feedback Amplifier," *IRE Trans. on Circuit Theory*, Vol. CT-1, pp. 20-25, June 1954.

The invention claimed is:

1. A transistor amplifier circuit having circuitry for cancellation of third order intermodulation distortion (IM3), and circuitry for neutralization of feedback capacitance.

2. The amplifier circuit of claim 1, being a single ended amplifier.

3. The amplifier circuit of claim 1, the circuitry for feedback capacitance neutralization comprising a current to current feedback transformer and a capacitance parallel coupled at an output path of the amplifier.

4. The amplifier circuit of claim 3, wherein the current to current feedback transformer is also used for setting the input impedance of the amplifier.

5. The amplifier circuit of claim 3, the current to current feedback transformer comprising a first inductor parallel coupled to an input of the amplifier, and a second inductor series coupled in an output path of the amplifier, the inductors being located to provide inductive mutual coupling.

6. The amplifier of claim 1, the circuitry for capacitance neutralization comprising a voltage feedback transformer and a capacitance parallel coupled at an input path of the amplifier.

7. The amplifier circuit of claim 3, further comprising a feedback resistor to compensate for amplifier input resistance.

8. The amplifier circuit of claim 2, an emitter of the transistor being grounded.

9. The amplifier circuit of claim 1, comprising a differential amplifier having two or more transistors.

10. The amplifier circuit of claim 9, comprising a differential common emitter amplifier.

11. The amplifier circuit of claim 1, the circuitry for cancellation of third order intermodulation distortion being located at the input of the amplifier, and being independent of the loading of the transistor due to the neutralization of the feedback capacitance.

12. The amplifier circuit of claim 1, the circuitry for cancellation of third order intermodulation distortion comprising resistive out of band terminations.

13. The amplifier circuit of claim 1, the circuitry for cancellation of third order intermodulation distortion being arranged such that a termination impedance is given by:

$$R_S(\Delta\omega) = R_S(2\omega) = \frac{\beta_F(n-1)}{g_m(2n-3)}$$

when $$C_{IN} - C_d = 2\tau_F g_m$$

or $$Z_{S,C}(\Delta\omega) = Z_{S,C}(2\omega) = R_{S,C} = \frac{\beta_F(n-1)}{2g_m(2n-3)}$$

when $$C_{IN} - C_d = 2\tau_F g_m$$

where $C_{IN}$ is the total equivalent transistor input capacitance after neutralization of the feedback capacitance.

14. A transistor amplifier circuit arranged in differential or single ended format, and having a first inductor parallel coupled to an input of the amplifier, and a second inductor series coupled in an output path of the amplifier, the inductors being located to provide inductive mutual coupling, and a capacitor parallel coupled to the output path, the capacitor and the inductors being dimensioned to neutralize parasitic feedback capacitance.

15. A transistor amplifier circuit arranged in differential or single ended format, and having a first inductor series coupled to an input of the amplifier, and a second inductor parallel coupled in an output path of the amplifier, the inductors being located to provide inductive mutual coupling, and a capacitor parallel coupled to an input path, the capacitor and the inductors being dimensioned to neutralize parasitic feedback capacitance.

16. A wireless transceiver having the amplifier circuit of claim 1.

17. A method of producing wireless signals using the transceiver of claim 16.

18. An integrated circuit having the amplifier circuit of claim 1.

19. Portable consumer equipment having a wireless transceiver having the amplifier circuit as set out in claim 1.

* * * * *